United States Patent
Hall et al.

(10) Patent No.: US 6,721,187 B2
(45) Date of Patent: Apr. 13, 2004

(54) MULTI-LAYERED HIGH DENSITY CONNECTIONS

(75) Inventors: Richard Ronald Hall, Endwell, NY (US); How Tzu Lin, Vestal, NY (US); Christopher John Majka, Owego, NY (US); Norman Corey Seastrand, Apalachin, NY (US); Matthew Francis Seward, Windsor, NY (US); Ronald Verne Smith, Friendsville, PA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/811,101

(22) Filed: Mar. 16, 2001

(65) Prior Publication Data

US 2002/0131252 A1 Sep. 19, 2002

(51) Int. Cl.[7] ............................. H05K 7/02; H05K 7/06; H05K 7/08; H05K 7/10
(52) U.S. Cl. ..................... 361/760; 361/764; 361/790
(58) Field of Search .................. 361/760–764, 361/790, 803; 174/255–260; 257/685–686

(56) References Cited

U.S. PATENT DOCUMENTS 5,656,553 A * 8/1997 Leas et al. ................. 438/15
6,560,109 B2 * 5/2003 Yamaguchi et al. ........ 361/704

* cited by examiner

*Primary Examiner*—Evan Pert
*Assistant Examiner*—Tuan Dinh
(74) *Attorney, Agent, or Firm*—James A. Lucas

(57) ABSTRACT

A multi-layer electronic structure includes an increased capacity for the attachment of active or passive devices thereto. This is achieved by creating a three-dimensional grid of connection points to electrically couple active or passive surface mounted devices to edge mounted devices. The grid pattern is useful with any laminate including circuit cards, ceramic modules and flexible circuits. The variety of electrical devices that may be connected to the cross-sectional substrate includes, but is not limited to, chips such as semiconductor chips, diodes, resistors, capacitors and printed wiring boards. The structure can be used to more rapidly pass data, such as optical data that is transmitted from a spectroscope through a VCSEL laser and the electronic structure to a computer for diagnostics and analysis. A stepped arrangement of circuitized laminates is described for this purpose.

9 Claims, 4 Drawing Sheets

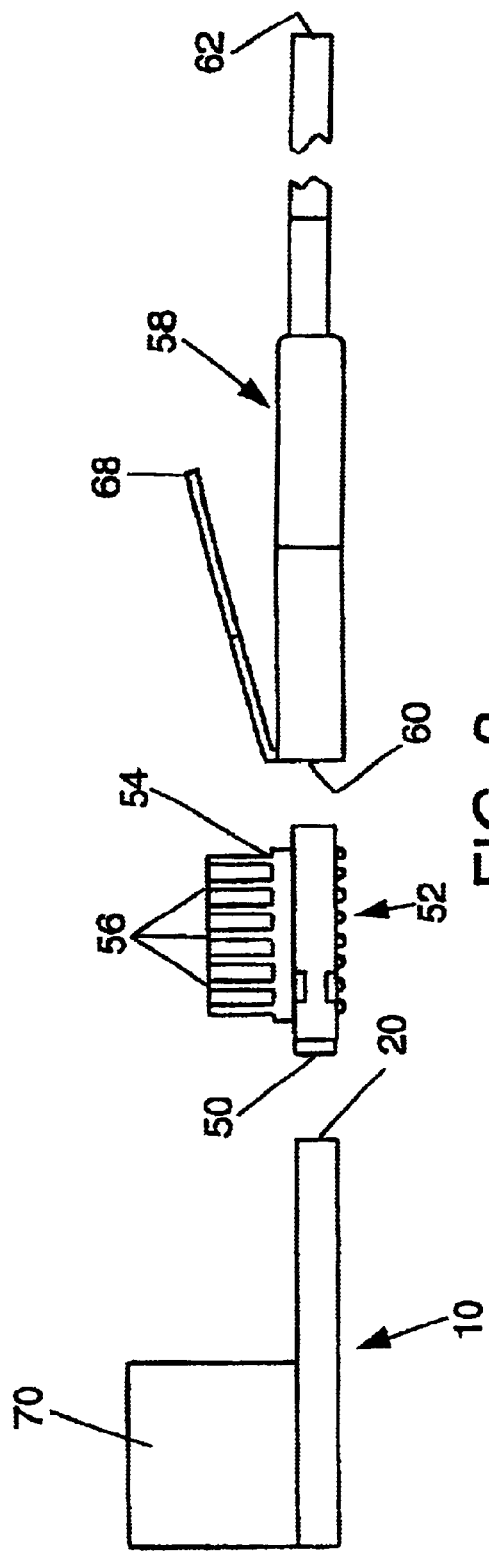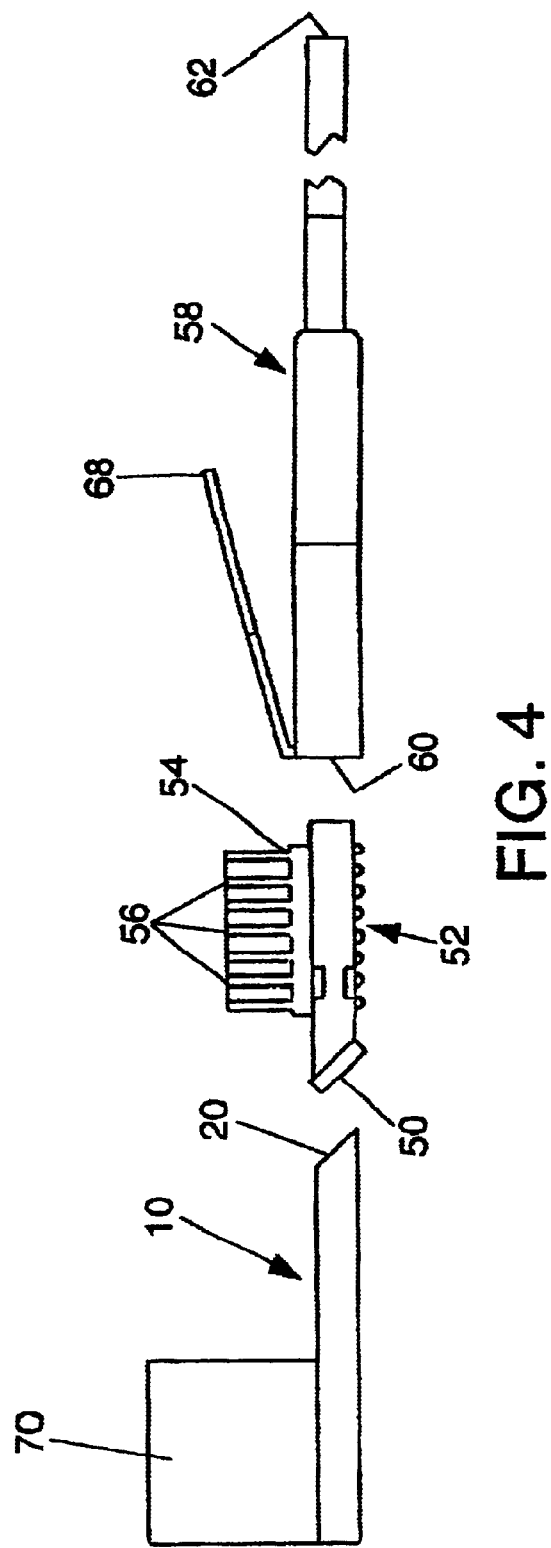

MULTI-LAYERED HIGH DENSITY CONNECTIONS

FIELD OF THE INVENTION

The present invention relates to an electronic interconnect system. More specifically, the invention relates to the three dimensional use of planar and edge surfaces of a circuitized sub assembly and the interconnection between circuit components or devices that are edge and surface mounted on the sub assembly. This arrangement allow for very dense packaging of such devices on the sub assembly.

BACKGROUND OF THE INVENTION

To reduce the cost and size of electronic computers while concomitantly increasing their performance capabilities, it is desirable to place as many electronic components in as small an area as possible. This can be achieved by creating many electronic circuits on a given region of a semiconductor chip. These chips are generally attached to the two planar surfaces of a printed circuit board (PCB), ceramic module or other substrate in a side by side arrangement with sufficient space between the chips to allow for the various electrical connections to be made from the PCB to the chips. Chip contact locations can be electrically interconnected to substrate contact locations by wires, flip-chip configurations, fuzz buttons, or other suitable means such as TAB tape.

As performance requirements of computers continue to increase, the time required to propagate and to deliver signals between chips and substrates remains critical. Yet, in conventional practice, only the two exterior faces of the substrate are used. The number of connections is typically increased by making the substrate larger in the planar (the x-y) directions. However, there are practical limits to the maximum size to which this plane can be expanded. At present, there may be as many as 30,000 connection points on the surface area of the board. Test probes for checking the continuity of all of these contacts are complex and are very expensive to build and maintain. Yet, there are continuing efforts to create even more pins and connections on the circuit boards, without increasing the size of the landscape. Others have attempted to overcome this problem in various ways.

U.S. Pat. No. 4,770,640 proposes the use of a monolithic integrated circuit device with a pattern of conductive paths on its surface. The device is placed against the edges of a multilayer microelectric module to provide connections between the layers of the module and with external devices.

U.S. Pat. No. 5,424,920 describes a number of integrated circuit chips secured together in a stack for such uses as DRAM and SRAM memory modules. The interior circuitry is connected through a dielectric end cap on the stack to external circuitry. Similarly, U.S. Pat. No. 5,246,566 and U.S. Pat. No. 5,517,057, owned by the assignee of the present invention, describe a laminated integrated circuit chip package with one or more metallization patterns on the edges of the package, and external circuits.

U.S. Pat. No. 5,718,936 describes a matrix head for electrostatic printing comprising a plurality of stacked printed circuit boards. The head includes conductive leads in the x-y plane of the stack that terminate at common edges of the stack. However, there is no reference to specific devices connected to these edge contacts.

An improvement in chip packaging density is possible if three dimensional wiring between closely spaced chips and other devices on electronic sub-assemblies can be achieved.

SUMMARY OF THE INVENTION

The present invention utilizes the third or edge dimension of a substrate to achieve a high density of connection points. This is achieved by creating a grid of the connection points in the other two planes (x-z or y-z planes).

The present invention relates to a printed circuit board having top and bottom generally parallel surfaces and at least one common edge surface between the top and bottom surfaces. A plurality of conductive leads are embedded in the circuit board and terminate in one or more connection points along the edge surface. These points electrically join one or more active or passive devices mounted to the top and/or the bottom surfaces (hereinafter referred to as surface mounted devices) to devices mounted on the edge surface of the printed circuit board (hereinafter referred to as edge mounted devices). A via may be used to electrically connect the surface mounted device to the conductive lead joined to the edge mounted device.

The invention further includes a method of increasing the number of devices on a circuitized substrate. The method comprises the steps of providing the substrate with top and bottom surfaces and at least one edge surface between the other two surfaces. A plurality of conductive leads are embedded in the substrate and terminate in one or more connection points along the edge surface. These leads serve to join active or passive devices on one of the planar surfaces to other active or passive devices mounted on the edge surfaces of the circuitized substrate. According to the method, numerous types of devices may be attached to the edge of the substrate including, for example, semiconductor chips, diodes, resistors and capacitors. Any laminated substrate, such as a circuit card or a flex circuit or a ceramic module, can be modified according to the present invention to achieve a high density pattern of connection points.

The substrate may be fabricated by building individual laminates with one or more conventional connectors embedded in each laminate. The edge of the laminate is then cross-sectioned to expose a matrix of electrical contact points to which connections may be made.

The invention also relates to an electronic sub assembly and to the method of making it. The sub assembly comprises a circuitized laminated substrate having top and bottom surfaces and at least one edge surface between the other two surfaces. The laminated substrate may be a conductive layer, for example a thin sheet of conductive material, such as copper laminated to a non-conductive sheet, such as a fiberglass reinforced prepreg or a ceramic. One or more active or passive devices are mounted on at least one of the top or bottom surfaces. A conductive lead is embedded in the non-conductive sheet of the substrate and is connected to an active or passive device mounted on the edge surface. The conductive lead is electrically connected to at least one of the devices on the planar surface of the substrate. The active or passive devices on the planar surfaces and on the edge surface may be any combination of semiconductor chips, diodes, resistors, capacitors and printed wiring boards. A via or plated through hole joins each device on the top or bottom surface to the conductive lead that is embedded in a non conductive layer and that is connected to an edge mounted device. The invention also relates to a printed circuit board and to its fabrication. The board has two spaced-apart parallel surfaces comprising a top surface and a bottom surface and at least one edge surface between the top and bottom surfaces. A plurality of conductive leads are embedded in the circuit board parallel to the planar surfaces and terminate in one or more connection points along the edge surface. An active or passive device is mounted on the edge surface and is joined through at least one of said connection points to at least one of the conductive leads. At least one active or passive device mounted on one of the parallel surfaces is joined to the edge mounted device. The printed circuit board may include a via or a plated through hole extending into the substrate from a surface mounted device into contact with a conductive lead connected to an edge mounted device.

The invention also relates to a device comprising a multi-layered circuitized sub assembly, and a semiconductor chip, preferably an optical chip coupled thereto. The sub assembly has two substantially parallel surfaces and at least one edge surface between the parallel surfaces. At least one conductive lead is embedded in the sub assembly generally parallel to the two parallel faces at surfaces, with one end forming electrical connection points. These points terminate in one or more electrical contact pads on said one edge surface. The semiconductor chip contains contacts electrically connected to the contact pads on the edge of the sub assembly. At least one active or passive device is mounted on a planar surface of the sub assembly and is in electrical contact with this conductive lead. The optical chip can be connected to the contact pads of the sub assembly using solder balls or any number of other connectors. The sub assembly may be formed into a plurality of laminates to make a stack. The laminates in the stack all have coplanar edge surfaces. They also have a stepped edge surface whereby each successive laminate in the stack is shorter than the laminate immediately there beneath. This serves to form an exposed planar surface or land on the lower laminate to accommodate an active or passive device that can be mounted on the exposed surfaces. One or more of the devices can be standard pin connectors that permit the device to be interfaced with a computer or suitable diagnostic device. One or more vias extend from each of the exposed planar surfaces of a laminate into the respective laminate to make contact with a conductive lead, thereby providing a connection between the semiconductor chip and the surface mounted connector. The coplanar edge of the stack of laminates can form a right angle with respect to the planar surfaces of the laminate. Alternatively, each edge may form a bias angle less or greater than 90° with respect to the planar surface. This bias angle increases the size of the contact surface of the pad to which the component connection points can be made. The connection points on the edge surface may be exposed by any suitable means, such as cutting or shearing of the edge of the laminates collectively or individually, followed by stacking in such a manner as to make the edges coplanar.

BRIEF DESCRIPTION OF THE DRAWINGS

FIG. 3 is an exploded side view showing one use of the present invention;

FIG. 4 is a side view showing a variation of the use shown in FIG. 3;

DETAILED DESCRIPTION OF THE INVENTION

The invention relates to a core or sub assembly of a printed circuit board. The core comprises a single laminate of a fiberglass reinforced prepreg and a conductive layer. One or more conductive leads or circuit lines are embedded in the prepreg. The conductive layer and the circuit lines typically are made of a metal, such as copper having high conductivity. The laminate has two generally flat surfaces that are parallel to one another, and one or more side edges between the planar surfaces. Each of the circuit lines terminates at an edge to form a plurality of connection points. The circuit lines can extend through the core 10 to another edge to form additional edge connection points. Each connection point can be coupled through a contact pad to another device, such as another PCB laminate, or any other active or passive device, such as a circuitized ceramic module, a semiconductor chip, a diode, a resistor, a capacitor or the like. The printed circuit board is composed of a specified number of these sub assemblies arranged in a stack and pressed or clamped together.

All of the circuit lines or conductive leads in one sub assembly generally are parallel to one another. In a stack of several sub assemblies, it should be understood that the lines in one sub assembly can terminate along one edge, and the corresponding lines in the next sub assembly can be aligned in another planar direction, such as perpendicular to those in the first core, terminating along an adjacent edge.

Within a given sub assembly, the circuit lines can be laid out in differing patterns depending on the configuration of active or passive devices being joined. For example, the lines can be arranged to form right angles, so that one end will terminate along one side edge and the other end will extend out through an adjacent side edge. In like manner, the circuit lines can be spread out in a fan shape or other pattern to create a greater spacing along an edge to permit larger devices to be mounted to the edge.

For purposes of the present invention, it should be understood that the sub assembly can be any one of a number of electronic substrates that are conventionally used in the fabrication of computers and other electronic devices. The substrate can be a printed circuit board, a chip carrier or a ceramic module. The devices mounted on the planar surfaces or the edges can be active or passive devices. Examples of such devices are diodes, capacitors, resistors, semiconductor chips and the like.

Turning now to the drawings, the present invention is displayed as a laminate comprising a plurality of individual layers, each of which has its own connector of conventional design. The layers are stacked on top of each other and the ends of the laminate are cross sectioned to expose a matrix of connection points. Conventional connections can then be made to each of the connection points through conductive pads according to established procedures.

Figure 1:
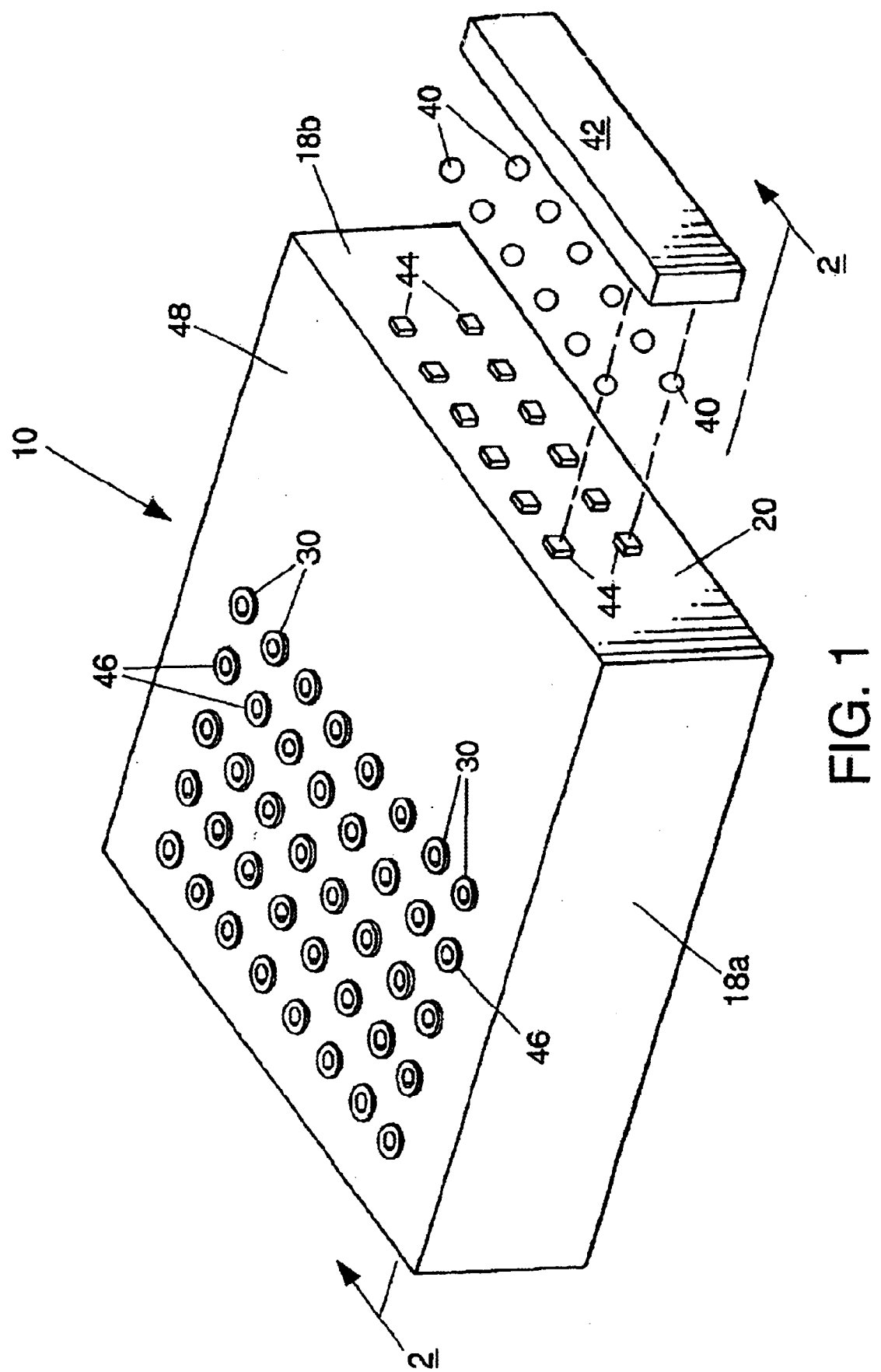
FIG. 1 is an exploded perspective view of the sub assembly of the present invention.
Figure 2:
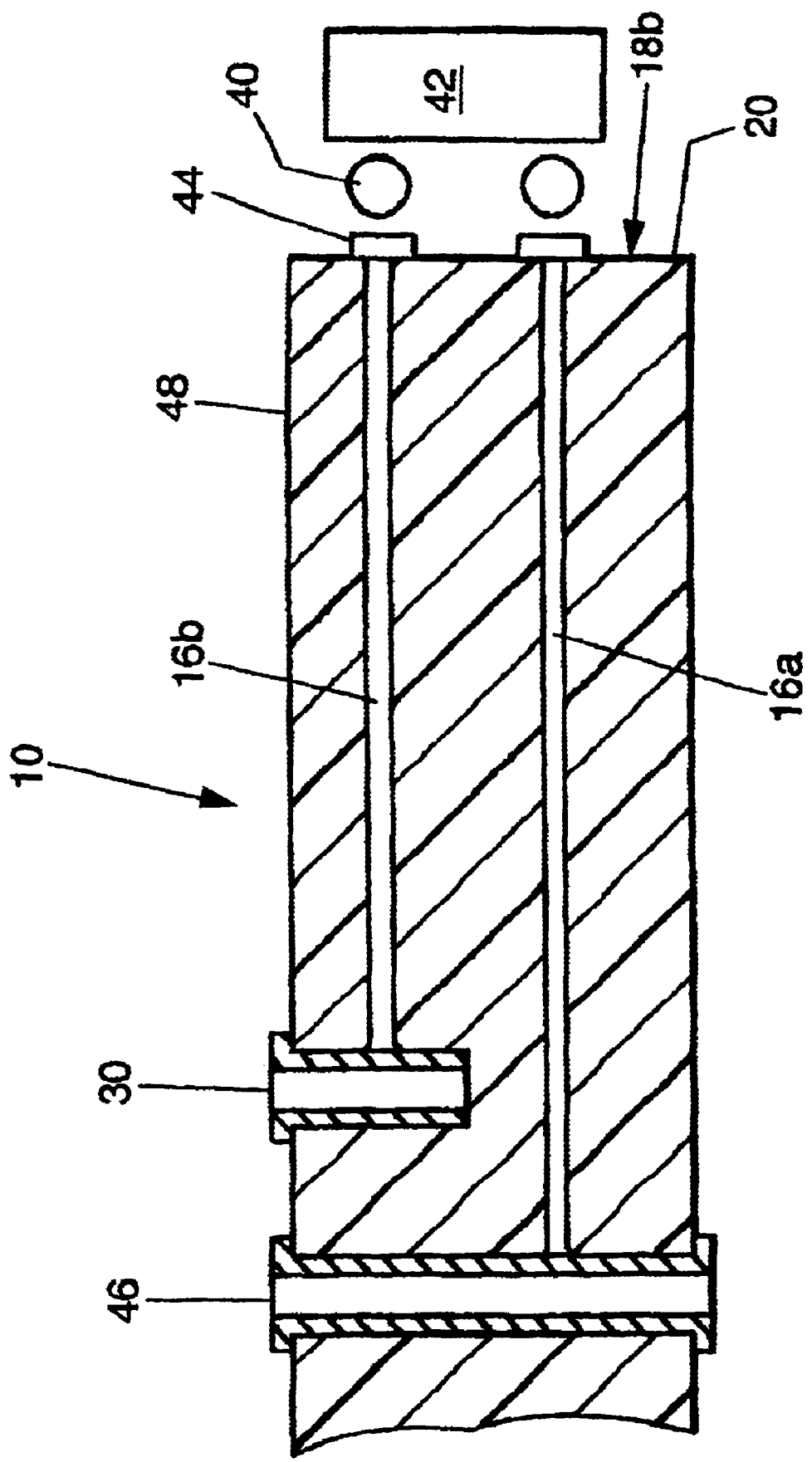
FIG. 2 shows an elevational view of FIG. 1 in cross section.

FIGS. 1 and 2 show an edge connection between a planar substrate 10 and a semiconductor chip 42, such as an optical chip. The substrate 10 represents a typical laminated structure well known in the art, such as the printed wiring board. The substrate 10 typically is rectangular in shape but other shapes, such as hexagonal and triangular, are likewise contemplated. The substrate 10 generally is flat in the planar direction with the top surface 48 and bottom surface parallel to one another. Two of the edges 18a, 18b are shown between the top and bottom surfaces. A plurality of conductive vias 30 or plated through holes (PTH) 46 are seen on the top surface 48. Also shown are a plurality of edge contact pads 44 on one edge 18b of the substrate 10. Interposed between the edge pads 44 and the chip 42 are a plurality of solder balls 40. The solder balls provide electrical contact between the chip 42 and the pads 44 on the substrate when the chip is attached to the substrate by conventional means. It can be readily observed that another chip or other active or passive device can be attached to each of the other edges of the substrate in a similar manner or by other means. The use of the edges of the substrate greatly increases the number of such devices that can be interconnected with the substrate, recognizing that many such devices are also attached to the planar surfaces of the substrate as is well known in the prior art. FIG. 2 shows a via 30 connected to an upper circuit line 16b, and a plated through hole 46 connected to the lower circuit line 16a.

Although solder balls are shown in FIGS. 1 and 2, it should be understood that an interposer using conductive spring elements can be used to make the electrical contact between the connection points on the edges of the core and the chip or other edge mounted device. Among the spring elements are metal filled elastomers, such as those sold by Tyco Inc. (formerly Thomas & Betts) as Metal Particle Interconnect Elastomers. Others are compressible wadded wires, commonly referred to as fuzz buttons, shown, for example, in the following patents: U.S. Pat. Nos. 5,552,752; 5,146,453 and 5,631,446. These are small, irregularly wound and inter-twined pads or balls and are made of gold plated beryllium copper wool or gold plated molybdenum wire. Metal springs are also used. These metal springs generally are leaf springs having a number of geometries, such as C-shaped or V-shaped.

A specific application for the present invention relates to a laminated circuitry useful with a VCSEL (vertical cavity surface emitting laser). This device utilizes a semiconductor laser that emits a laser beam perpendicular to its p-n junction rather than on the edge of the junction. The laser is a wafer typically made from stacks of doped gallium arsenide or aluminum gallium arsenide crystals. The resultant laser beam is circular in cross section and has low divergence, making the laser useful for high speed transmission of data and telecommunication information. The device is particularly useful for spectroscopy which requires high speed fiber optic connections. The successful operation of the device is dependent on the coupling of the laser-transmitted output data from the fiber optic cable to a computer or other device used to monitor and process the visual images as seen by the scope.

FIG. 3 is a view showing a VCSEL wafer 50 mounted to an optical coupler 52. A heat sink 54 with heat transfer fins 56 is joined to the coupler to remove generated heat from the laser wafer 50 and associated circuitry. Also shown is a fiber optic cable 58 having one end 60 adapted to be joined to the coupler 52. A handle 68 helps to attach and detach the cable from the coupler 52. The wafer 50 is typically about 1/8" by 1/16" in the planar direction, with a thickness of about 0.03". The individual fiber optic light sources are about 0.001" in diameter and are tightly spaced. Each of these light sources transmits optical data that must be relayed to a remote site to be read and/or analyzed. The optical data is transmitted through the laser wafer to a plurality of optical receivers (not shown) on the edge of a printed circuit core 10. The distal end 62 of the cable 58 is joined to the spectroscope that is used for diagnosis or exploration or for other medical purposes, in accordance with established medical protocols. The core is electrically joined to a conventional connector 70, such as those available from Amphenol or Molex, that is mounted on a planar surface 12 of the core. The wafer 50 is adapted to be optically connected through an optically transparent media to the edge 20 of the core 10 facing the wafer. Preferably, the media is an optically transparent encapsulant, such as a clear epoxy having the same or similar refractive index as that of the wafer. Air is not normally used for this purpose because of the loss of transmission across air gap, regardless of how small the air gap may be.

To create more space on the edge 20 of the core 10, the edge can be beveled at an angle of less than 90°, e.g. between 30° and 60°. In like manner, the wafer 50 is mounted to the coupler 52 at the same angle. This configuration is shown in FIG. 4. One edge 20 of the stacked laminate is sheared to expose a large number of edge connection points (not shown) optically engaging the individual light sources emanating from the laser wafer 50. The end can be cut at right angles to the planar surfaces of the laminate or, as shown, at a lesser angle. It should be understood that more than one VCSEL can be optically coupled to the optical module.

Figure 5:
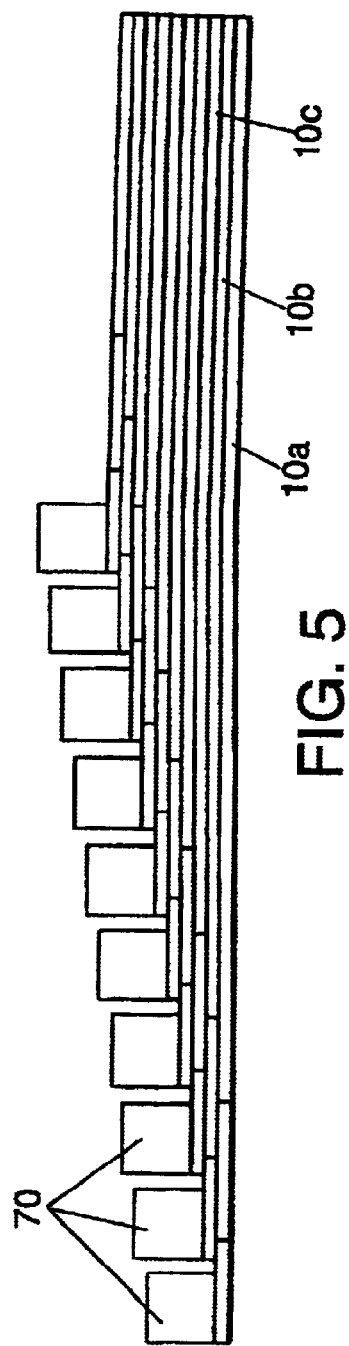
FIG. 5 is a side view showing a stacked laminate of the present invention using a plurality of planar connectors.
Figure 6:
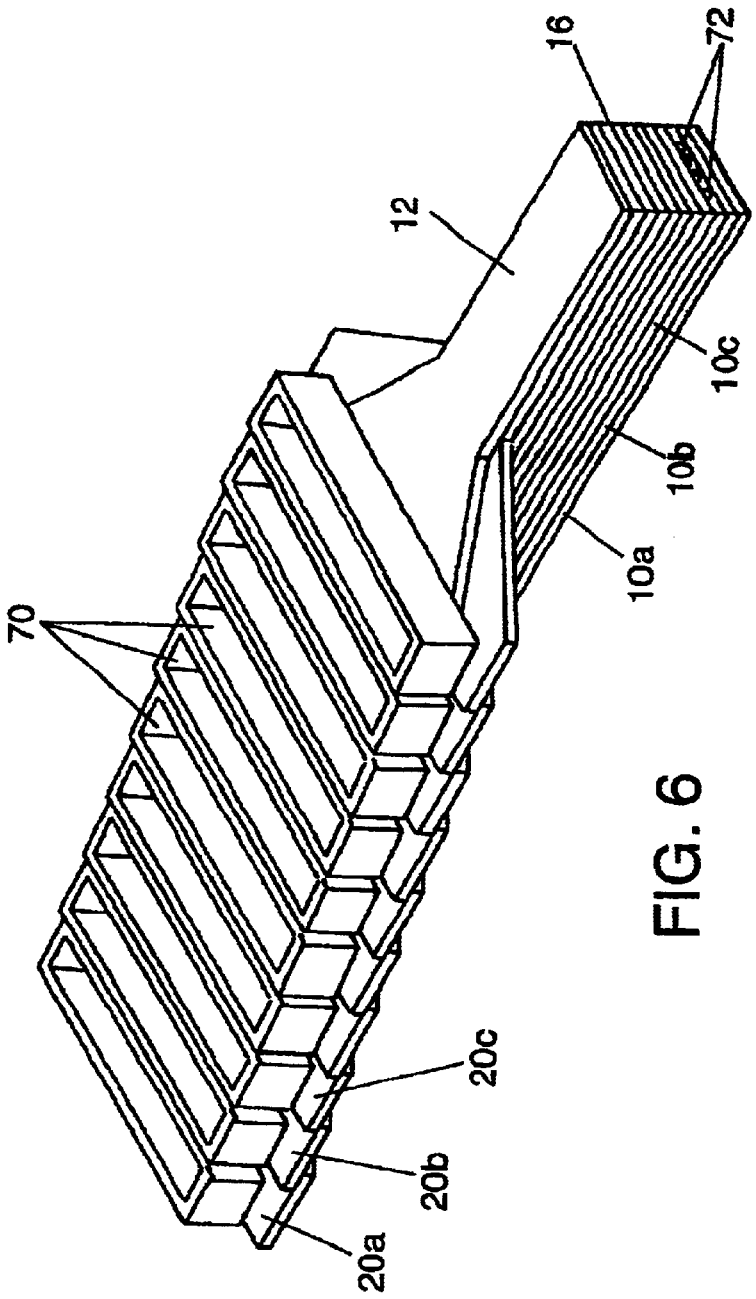
FIG. 6 is a perspective view of the stacked laminate of FIG. 5.

Another feature of the present invention involves the use of a stacked laminate of PCBs as shown In FIGS. 5 and 6. The substrate may be fabricated by building individual laminates with one or more conventional connectors on the planar surface of each laminate. Each laminated sub assembly is typically about 1/8" thick. A conventional connector is mounted on a planar surface 20a, 20b, 20c, etc of each laminated core 10a, 10b 10c. Each successive laminate 10 in the stack 24 is progressively shorter than the one below it, thereby accommodating a staggered array of connectors 60 as shown. After the stacked laminate is pressed together and cured, the edges 16 of the laminates opposite the connectors are sheared off to expose a matrix of connection points 72 to which electrical or optical contacts may be made. Each end can be cut at right angles to the planar surface of the stack or, to achieve a larger pad surface, the end can be cut at an angle of less than 90°, as shown, with a single laminated core in FIG. 4. It should be understood that means other than shearing or cutting can be used to expose the ends of the conductive leads at the edge surfaces without departing from the intent of the present invention.

The optical transmission of data, for example, as discussed above in connection with the VCSEL, involves the use of transmitters and receivers in accordance with standard procedures that are well known in the art. The transmitters can be doped semiconductors that have little pads that transmit data. In like manner, the receivers receive the transmitted data. The pads typically are mounted on the end of the VCSEL wafer to transmit, or on the edge of the substrate 10 to receive the data.

The specific details and operation of the sub assembly described herein, as well as the details of the various passive and active devices that are used here, are known to persons of ordinary skill in the art. Accordingly, these details do not comprise a part of the present invention except to the extent that they and their operation have been modified to become part of the present invention or have been improved through the use of the invention.

While the invention has been described in combination with embodiments thereof, it is evident that many alternatives, modifications, and variations will be apparent to those skilled in the art in light of the foregoing teachings. In addition to coupling an edge mounted device to a surface mounted device, it should be understood that two or more edge mounted devices can be coupled to each other within the same substrate. Furthermore, an edge of a circuit board can be sheared to expose a matrix of connection points and can then be abutted or coupled to the edge of another circuit board that has been cut to expose a corresponding matrix. Thus, for a typical board having a rectangular shape, this procedure could be followed to butt the four edges against a corresponding edge of four other circuit boards. As a further extension, a circuit board having a hexagonal cross section could be edge-butted against six other circuit boards. Accordingly, the invention is intended to embrace all such alternatives, modifications and variations as fall within the spirit and scope of the appended claims.

What is claimed is:

1. An electronic sub assembly comprising a circuitized laminated substrate having top and bottom surfaces, and at least one beveled edge surface between said top and bottom surfaces, at least one active or passive device mounted on said at least one beveled edge surface, at least one other active or passive device mounted on at least one of the top and bottom surfaces, a conductive lead embedded in the substrate electrically connected to the active or passive device mounted on said at least one edge surface, the conductive lead also electrically connected to the at least one other active or passive device on the top or bottom surface.

2. The sub assembly according to claim 1 wherein each of the active or passive devices is selected from the group including chips, diodes, resistors, capacitors and printed wiring boards.

3. The sub assembly according to claim 1 further including an electrically conductive via extending into the substrate from each device on the top or bottom surface into contact with a conductive lead connected to an edge mounted device.

4. The sub assembly according to claim 1 wherein the laminated substrate is selected from the group comprising a single or multiple laminates of a fiberglass reinforced prepreg and a conductive layer, and a single or multiple laminates of a ceramic module and a conductive layer.

5. The electronic sub assembly according to claim 1 wherein the edge surface is beveled at an angle of between 30° and 60° with respect to the top or bottom surface.

6. A printed circuit board having two spaced apart, generally parallel surfaces comprising a top surface and a bottom surface, a beveled edge surface between said top and bottom surfaces, a plurality of conductive leads embedded in the circuit board parallel to the top and bottom surfaces and terminating in one or more connection points along the beveled edge surface, an active or passive device mounted on said edge surface and electrically joined through at least one of said connection points to at least one of the conductive leads, and at least one other active or passive device mounted on the top or bottom surface electrically joined through one of said conductive leads to the edge mounted device.

7. The printed circuit board according to claim 6 further including a via on the top or bottom surface, and coupled to a top or bottom mounted device, said via extending into the substrate into contact with a conductive lead connected to said edge mounted device.

8. The printed circuit board according to claim 6 wherein each active or passive device is selected from the group including chips, diodes, resistors, capacitors and printed wiring boards.

9. The printed circuit board according to claim 6 wherein the edge surface is beveled at an angle of between 30° and 60° with respect to the top or bottom surface.

* * * * *